(12) United States Patent
Jung et al.

(10) Patent No.: US 12,176,234 B2
(45) Date of Patent: Dec. 24, 2024

(54) ASSEMBLY AND METHOD FOR TRANSFERRING SUBSTRATE

(71) Applicant: SEMES CO., LTD., Cheonan-si (KR)

(72) Inventors: Sung Hyuk Jung, Suncheon-si (KR); Chung Woo Lee, Suwon-si (KR)

(73) Assignee: SEMES CO., LTD., Cheonan-si (KR)

( * ) Notice: Subject to any disclaimer, the term of this patent is extended or adjusted under 35 U.S.C. 154(b) by 329 days.

(21) Appl. No.: 17/872,922

(22) Filed: Jul. 25, 2022

(65) Prior Publication Data
US 2023/0084162 A1 Mar. 16, 2023

(30) Foreign Application Priority Data

Aug. 10, 2021 (KR) .................. 10-2021-0105171

(51) Int. Cl.
H01L 21/68 (2006.01)
B25J 9/16 (2006.01)
B25J 11/00 (2006.01)
B25J 13/08 (2006.01)
B25J 19/02 (2006.01)
H01L 21/687 (2006.01)

(52) U.S. Cl.
CPC .......... *H01L 21/681* (2013.01); *B25J 9/1697* (2013.01); *B25J 11/0095* (2013.01); *B25J 13/08* (2013.01); *B25J 19/022* (2013.01); *H01L 21/68707* (2013.01)

(58) Field of Classification Search
CPC ...... B25J 9/1697; B25J 19/021; B25J 19/023; B25J 9/1676; B25J 9/1666; B25J 11/0095; B25J 13/08; B25J 19/022; G05B 19/4061; G05B 2219/39082; G05B 2219/37631; G06V 2201/06; G06V 10/764; G06V 10/751; G06T 1/0014; G06T 7/10; G06T 7/11; H01L 21/67259; H01L 21/67742; H01L 21/681; H01L 21/68707
USPC .......................................... 700/259
See application file for complete search history.

(56) References Cited

U.S. PATENT DOCUMENTS 6,356,091 B1 * 3/2002 Nimtz ............... H01L 21/67265
356/614
11,241,791 B1 * 2/2022 Ebrahimi Afrouzi .. G01C 22/02
(Continued)

FOREIGN PATENT DOCUMENTS

JP 09-283604 10/1997
JP 2011-211048 10/2011
(Continued)

OTHER PUBLICATIONS

Translation of WO2022138864 (Year: 2021).*
(Continued)

*Primary Examiner* — Adam R Mott
*Assistant Examiner* — James Miller Watts, III

(57) ABSTRACT

A substrate transfer assembly that transfers a substrate includes a robot arm configured to transfer the substrate, a laser disposed at the robot arm and emitting one or more rays of light, an image sensor disposed at the robot arm and generating a photographed picture or video including an image of a front object by the one or more emitted rays of light, and a control circuit configured to control transfer of the substrate based on the image present in the photographed picture or video.

20 Claims, 10 Drawing Sheets

(56) References Cited

U.S. PATENT DOCUMENTS

| | | | |
|---|---|---|---|
| 2002/0009357 A1* | 1/2002 | Hanson | H01L 21/67259 414/940 |
| 2002/0042666 A1* | 4/2002 | Bacchi | H01L 21/68707 700/275 |
| 2003/0130761 A1* | 7/2003 | Schauer | H01L 21/67265 700/213 |
| 2006/0015279 A1* | 1/2006 | Saeki | B62D 57/032 702/94 |
| 2007/0213874 A1* | 9/2007 | Oumi | B25J 9/1697 700/245 |
| 2008/0225261 A1* | 9/2008 | Hirayanagi | G03F 7/70708 355/72 |
| 2012/0002216 A1* | 1/2012 | Shibata | H01L 21/67766 356/614 |
| 2013/0010081 A1* | 1/2013 | Tenney | H04N 13/20 348/47 |
| 2015/0168954 A1* | 6/2015 | Hickerson | G01S 17/04 901/1 |
| 2016/0279791 A1* | 9/2016 | Watanabe | G06V 20/64 |
| 2016/0375592 A1* | 12/2016 | Szatmary | B25J 9/1674 700/250 |
| 2017/0133253 A1* | 5/2017 | Fischer | G01B 11/272 |
| 2017/0173791 A1* | 6/2017 | Dalibard | B25J 9/1653 |
| 2020/0398446 A1* | 12/2020 | Wang | B25J 9/1664 |
| 2021/0082729 A1* | 3/2021 | Hansen | H01L 21/67294 |
| 2021/0125851 A1* | 4/2021 | Shivanna | B25J 9/1697 |
| 2021/0187741 A1* | 6/2021 | Marthi | B25J 9/1676 |
| 2022/0111528 A1* | 4/2022 | Dhamasia | B25J 19/06 |
| 2022/0126451 A1* | 4/2022 | Hopkinson | B25J 9/1676 |
| 2022/0155065 A1* | 5/2022 | Hidaka | B25J 9/1697 |
| 2022/0371200 A1* | 11/2022 | Yu | B25J 9/1653 |
| 2023/0166406 A1* | 6/2023 | Landi | G06T 7/13 382/153 |

FOREIGN PATENT DOCUMENTS

| | | | | |
|---|---|---|---|---|
| JP | 2011211048 A | * | 10/2011 | |
| JP | 2018015834 A | * | 2/2018 | |
| KR | 101909181 | | 9/2017 | |
| WO | WO-2014145471 A1 | * | 9/2014 | B23Q 17/2233 |
| WO | WO-2022138864 A1 | * | 6/2022 | B25J 13/00 |

OTHER PUBLICATIONS

Translation of JP2011211048 (Year: 2011).*
Translation of JP2018015834 (Year: 2014).*
Office Action from the Korean Intellectual Property Office dated Dec. 12, 2022.

* cited by examiner

ASSEMBLY AND METHOD FOR TRANSFERRING SUBSTRATE

CROSS REFERENCE TO RELATED APPLICATION

The present application claims priority to Korean Patent Application No. 10-2021-0105171, filed Aug. 10, 2021, the entire contents of which is incorporated by reference herein for all purposes.

BACKGROUND OF THE INVENTION

1. Field of the Invention

The present invention relates to an assembly and a method for transferring a substrate, and more particularly, to a technique capable of emitting light in a forward movement path and grasping the degree of risk of collision based on a photographed picture or video obtained by photographing the shape of an image formed by the emitted light.

2. Description of the Related Art

Various processes such as photolithography for supplying a photosensitive liquid onto a substrate, etching, ion implantation, deposition, and cleaning are performed in order to manufacture a semiconductor element or a liquid crystal display. The substrate is transferred from one device to another device during such a process. In such a transfer process, the substrate may be handled by a substrate transfer assembly such as a transfer robot.

In general, for example, a semiconductor manufacturing facility such as a spinner system or a scrubber includes a plurality of processing units, and a wafer is transferred to the processing unit by a transfer robot. The processing units perform the respective processes, and the wafer is transferred to the outside by the transfer robot.

In such substrate transfer by the transfer robot, there is a risk of collision with various objects. In the case of severe collision, the operation of the semiconductor manufacturing facility itself may be required to be stopped. In addition, even though slight collision occurs, the substrate being transferred may be damaged.

Furthermore, collision prevention of the transfer robot is implemented in software, but the risk of collision may be increased by transferring the substrate to an abnormal position when teaching data and the like on substrate transfer have a problem.

Techniques for determining the risk of collision based on a picture or video obtained by photographing the front with a camera have been proposed. However, in such related arts, the speed and reliability are poor because an analysis on all objects present in the photographed picture or video is required.

Techniques for emitting light and determining the risk of collision by receiving the reflected light have also been proposed. However, in such related arts, it is not possible to emit light to the entire area in front and receive reflected light. Thus, it is not possible to grasp various obstacles present in front, and it is not possible to prevent collision with an obstacle located in an area in which the light does not reach.

Examples of the related art include Korean Patent No. 10-1909181.

SUMMARY OF THE INVENTION

The present invention has been devised to solve the problems of the prior art as described above, and an object of the present invention is to provide a collision prevention technique having high stability and reliability in substrate transfer with a substrate transfer robot.

In particular, the present invention has been devised to solve the problem that the collision prevention of the transfer robot is implemented in software, and thus the risk of collision is increased by transferring a substrate to an abnormal position when teaching data and the like on substrate transfer have a problem.

In addition, the present invention has been devised to solve the problem that the speed and reliability are poor because an analysis on all objects present in a picture or video image is required when the risk of collision is determined based on the picture or video obtained by photographing the front with a camera.

In addition, the present invention has been devised to solve the problem that, in a case where light is emitted and the risk of collision is determined by receiving reflected light, it is not possible to grasp all various obstacles present in front, and thus it is not possible to prevent collision with an obstacle located in an area in which light does not reach.

The objects of the present invention are not limited to the above description, and other objects and advantages of the invention which are not mentioned can be clearly understood by those skilled in the art as described below.

According to an aspect of the present invention, a substrate transfer assembly that transfers a substrate includes a robot arm configured to transfer the substrate, a laser disposed at the robot arm and emitting one or more rays of light, an image sensor disposed at the robot arm and generating a photographed picture or video including an image of a front object by the one or more emitted rays of light, and a control circuit configured to control transfer of the substrate based on the image present in the photographed picture or video.

According to an aspect of the present invention, a substrate transfer method of transferring a substrate includes emitting light, generating a picture or video including an image of a front object by the emitted light, and controlling transfer of the substrate based on the image present in the picture or video.

According to an aspect of the present invention, a substrate transfer assembly that transfers a substrate includes a robot arm configured to transfer the substrate, a substrate support connected to a first end of the robot arm and configured to support the substrate, a laser disposed at a first region of the robot arm, and emits a ray of light in a diagonal direction of a forward movement path of the substrate support, wherein the first region is adjacent to the first end of the robot arm, and wherein the laser is disposed adjacent to a side of the first region which is spaced apart from a center of the first region in a direction perpendicular to the forward movement path of the substrate support, a camera disposed at the robot arm and photographing a picture or video including an image of a front object by the emitted ray of light, and a control circuit configured to control transfer of the substrate by dividing the photographed picture or video into a plurality of areas, and determining a risk factor based on an area in which the image is located within the picture or video.

According to the present invention, it is possible to stably and reliably prevent collision with a front object in substrate transfer with a substrate transfer robot.

In particular, in the case of recognizing a front object by emitting light and receiving reflected light, it is possible to solve the problem of difficulty in recognizing all wide areas in front. In addition, in the case of recognizing a front object from a front photographed picture or video, it is possible to solve the problem of difficulty in a quick and immediate response because an analysis on all objects present in the photographed picture or video is required.

The effects of the present invention are not limited to the effects described above, and effects not mentioned can be clearly understood by those skilled in the art, from the specification and the attached drawings.

BRIEF DESCRIPTION OF THE DRAWINGS

The above and other objectives, features, and other advantages of the present disclosure will be more clearly understood from the following detailed description taken in conjunction with the accompanying drawings, in which.

DESCRIPTION OF THE EMBODIMENTS

Hereinafter, embodiments of the present invention will be described in detail with reference to the accompanying drawings, but the present invention is not limited by the embodiments.

In order to describe the present disclosure, the operational advantages of the present disclosure, and the objectives achieved by the present disclosure, embodiments of the present disclosure are illustrated below, and the present disclosure is described with reference to the embodiments.

First, the terminology used herein is for the purpose of describing particular embodiments only and is not intended to be limiting. As used herein, the singular forms "a", "an", and "the" are intended to include the plural forms as well, unless the context clearly indicates otherwise. The terms "comprise", "include", "have", and the like when used in this application should be understood to specify the presence of stated features, numbers, steps, operations, elements, components, or combinations thereof but not to preclude the presence or addition of one or more other features, numbers, steps, operations, elements, components or combinations thereof.

In describing the present disclosure, when it is decided that a detailed description of a known configuration or function related to the disclosure makes the gist of the disclosure unclear, the detailed description is omitted.

The present invention relates to a technique capable of emitting light in a forward movement path of a substrate transfer assembly and grasping the degree of risk of collision based on a photographed picture or video obtained by photographing the shape of an image formed by the emitted light.

Figure 1:
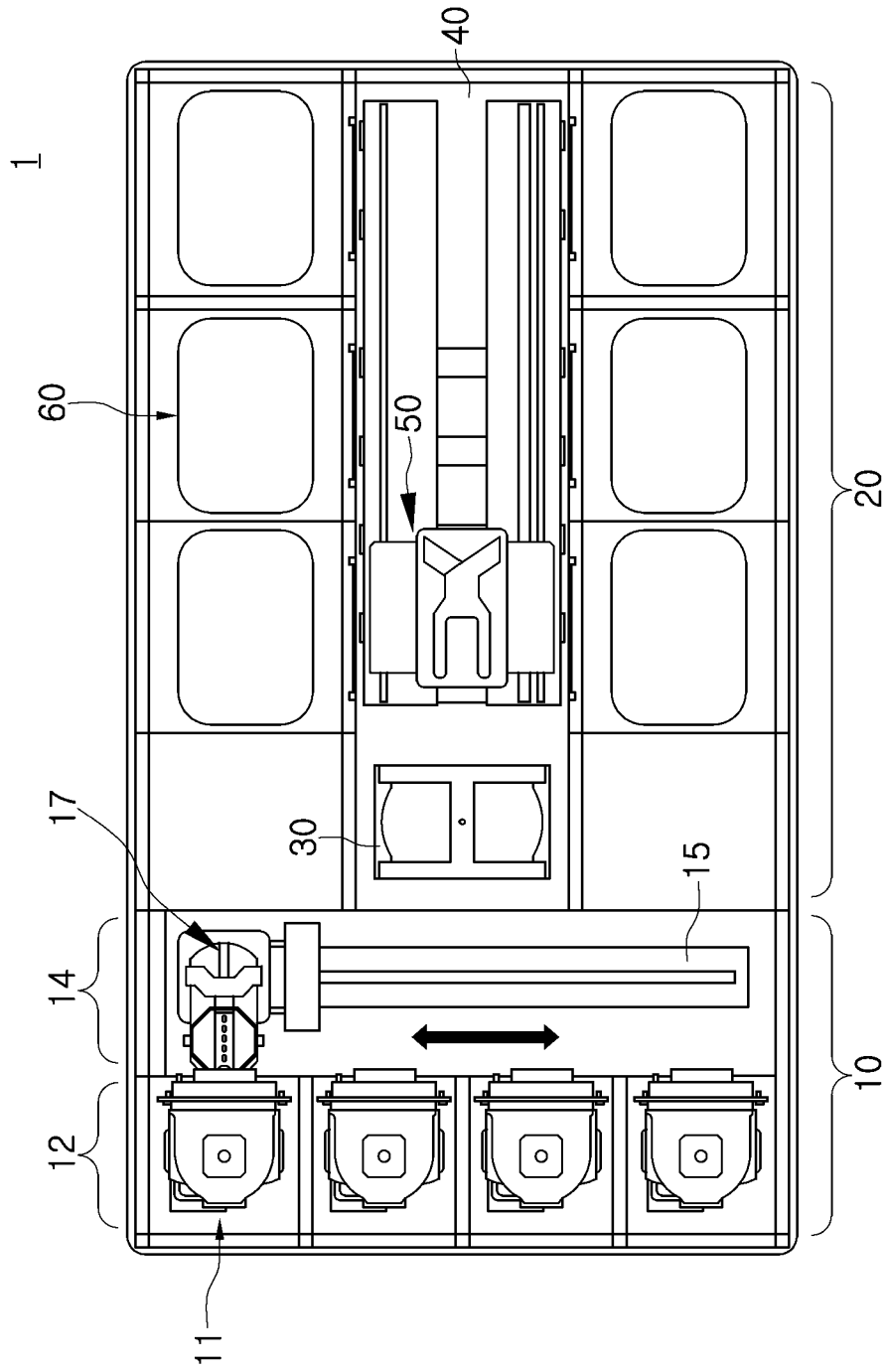
FIG. 1 is a plan view schematically illustrating an embodiment of a substrate processing system to which the present invention is applied.

FIG. 1 is a plan view schematically illustrating an embodiment of a substrate processing system to which the present invention is applied.

A substrate processing system 1 to which the present invention is applied includes an index unit 10 and a process processing unit 20. The index unit 10 and the process processing unit 20 may be arranged in a line.

A carrier 11 has a function of carrying a substrate into a process module 13 and drawing out the substrate subjected to process processing by the process module 13. A load port 12 may be provided between the carrier 11 and the process module 13. The index module 11 may carry the substrate into the process module 13 through the load port 12 and draw the substrate out from the load port 12.

The index unit 10 may include a load port 12 and a transfer frame 14.

The carrier 11 in which a substrate W is accommodated may be mounted on the load port 12. A plurality of load ports 12 may be provided and may be arranged in a line. The number of load ports 12 may increase or decrease in accordance with process efficiency and footprint conditions of the substrate processing system 1.

A front opening unified pod (FOUP) may be used as the carrier 11. A plurality of slots for accommodating substrates in a state of being arranged horizontally with respect to the ground may be formed in the carrier 11.

The transfer frame 14 may be disposed adjacent to the load port 12. Preferably, the transfer frame 14 may be disposed between the load port 12 and a buffer unit 30 in the process processing unit 20. The transfer frame 14 may include an index rail 15 and an index robot 17. The index robot 17 may be mounted on the index rail 15. The index robot 17 may transfer a substrate W between the buffer unit 30 and the carrier 11. The index robot 17 may move linearly along the index rail 15 or rotate about an axis.

The process processing unit 20 may be disposed in the rear of the substrate processing system 1 to be adjacent to the index unit 10.

The process processing unit 20 may include the buffer unit 30, a moving passage 40, a main transfer robot 50, and a substrate processing device 60.

The buffer unit 30 may be disposed in front of the process processing unit 20 and may serve as a location in which a substrate W is temporarily accommodated and waits before the substrate W is transported between the substrate processing device 60 and the carrier 11. The buffer unit 30 may be provided with a slot (not illustrated) in which the substrate W is placed, and a plurality of slots (not illustrated) may be provided to be spaced from each other.

The moving passage 40 may be disposed corresponding to the buffer unit 30 and may provide a passage for moving the main transfer robot 50. The substrate processing apparatuses 60 may be disposed on both sides of the moving passage 40 to face each other. A moving rail may be installed on the moving passage 40. The main transfer robot 50 moves on the moving rail, and the moving rail is capable of ascending and descending to the upper and lower levels of the substrate processing device 60 and the upper and lower levels of the buffer unit 30.

The main transfer robot 50 may be installed on the moving passage 40 and may transfer a substrate W between the substrate processing device 60 and the buffer unit 30 or between the substrate processing devices 60. The main transfer robot 50 may move linearly along the moving passage 40 or rotate about an axis.

A plurality of substrate processing devices 60 may be disposed, and the substrate processing devices 60 may be disposed on both sides of the moving passage 40. Some of the substrate processing devices 60 may be arranged in a longitudinal direction of the moving passage 40, and some of the substrate processing devices 60 may be arranged to be stacked. The arrangement position or the number of substrate processing devices 60 may be changed as required. In an example, the substrate processing device 60 may be provided only on one side of the moving passage 40, or the substrate processing device 60 may be provided as a single layer on one side and both sides of the moving passage 40.

The substrate transfer assembly according to the present invention may be disposed in the above-described substrate processing system 1 or the like. In an example, the substrate transfer assembly according to the present invention may be applied to the index robot 17, the main transfer robot 50, or the like.

An example of the substrate transfer assembly according to the present invention will be described below.

Figure 2:
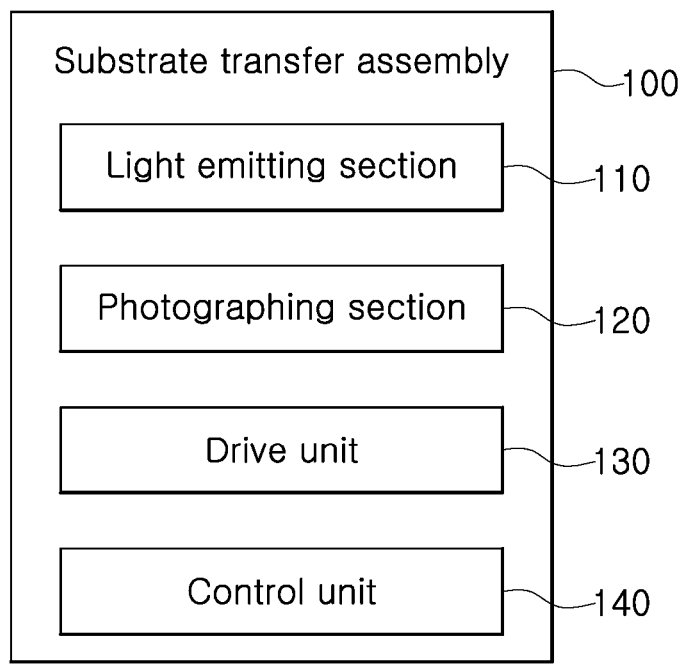
FIG. 2 is a diagram illustrating a configuration of an example of a substrate transfer assembly according to the present invention.

FIG. 2 is a diagram illustrating a configuration of the example of a substrate transfer assembly according to the present invention.

The substrate transfer assembly 100 includes a light emitting section 110, a photographing section 120 (i.e., an image sensor or a camera having an image sensor), a control unit 140 (i.e., a control circuit), and a drive unit 130. The substrate transfer assembly 100 further includes the basic components for substrate transfer.

The light emitting section 110 (i.e., a laser) emits one or more rays of light forward. Here, the light emitting section 110 may emit light forward in a form of a vertical line or in a circular or a polygonal form.

In an example, the light emitting section 110 may emit light in a diagonal direction of a forward movement path. In addition, the light emitting section 110 may emit a first ray of light in a direction of the forward movement path and emit a second ray of light in the diagonal direction of the forward movement path. The number of rays of light emitted from such a light emitting section 110, a light emission direction, and a light emission angle may be changed as appropriate.

Preferably, the light emitting section 110 may emit colored laser light. When the light emitting section 110 emits a plurality of rays of light, the light emitting section 110 may emit laser light having the same color or emit rays of laser light having different colors from each other.

More preferably, the light emitting section 110 may emit light to deviate from a substrate mounted in front for transfer.

The photographing section 120 is equipped with a camera having an image sensor, and may generate a photographed picture or video by photographing an image formed on a front object by the light emitted from the light emitting section 110.

The photographing section 120 may generate a picture by photographing the front under various conditions, for example, a predetermined time interval or when an event occurs by recognition of a proximity sensor. In addition, the photographing section 120 may generate a real-time photographed picture or video by continuously photographing the front.

In addition, the photographing section 120 may be equipped with a plurality of cameras, and may generate a plurality of photographed picture or videos. In this case, the arrangement position of each of the cameras may be adjusted to photograph, at a different angle, an image formed on a front object by light.

The drive unit 130 may transfer the mounted substrate to a target position by ascending or descending the mounted substrate, or moving the mounted substrate to the front or the rear.

The control unit 140 may control substrate transfer based on a photographed picture or video generated by the photographing section 120. The control unit 140 may grasp the position of an image present in the photographed picture or video and control the substrate transfer based on the grasped position. Here, the control unit 140 may be disposed as an internal component of the substrate transfer assembly 100 or may be separate from the substrate transfer assembly 100 and be disposed as an external component of the substrate transfer assembly 100.

Figure 3:
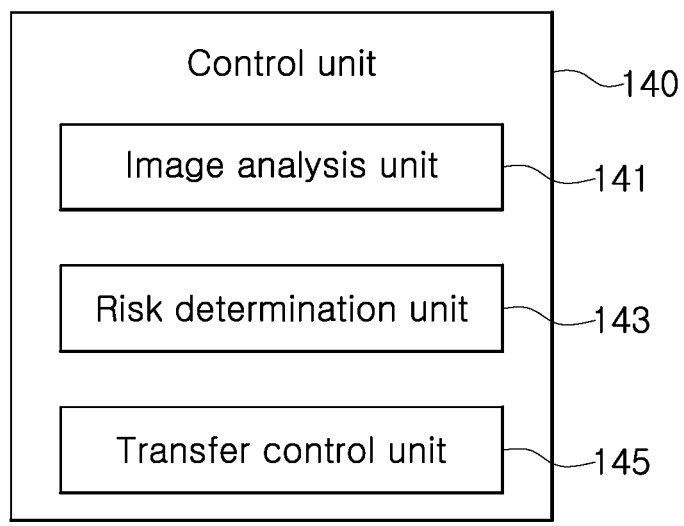
FIG. 3 is a diagram illustrating a configuration of an example of a control unit in the substrate transfer assembly according to the present invention.

As an example of the control unit 140, FIG. 3 is a diagram illustrating a configuration of an example of a control unit in the substrate transfer assembly according to the present invention.

The control unit 140 may include a picture or video analysis unit 141, a risk determination unit 143, a transfer control unit 145, and the like.

The picture or video analysis unit 141 may receive the photographed picture or video provided from the photographing section 120 and grasp an image by image processing. Here, the picture or video provided from the photographing section 120 may be a picture or a real-time video.

The picture or video analysis unit 141 may perform image processing on the photographed picture or video to extract an image, grasp the position or size of the image, and track the movement of the image. In addition, the picture or video analysis unit 141 may generate a combined picture or video in which divided areas are displayed, by matching an area layer in which division into a plurality of areas is performed, with the photographed picture or video.

Furthermore, in a case where the photographing section 120 generates a plurality of photographed picture or videos with a plurality of cameras, the picture or video analysis unit 141 may compare photographed picture or videos photographed at different angles or different positions in the same time period so as to extract the image or grasp the position or size of the image.

The risk determination unit 143 may determine the degree of risk of collision based on the position, size, movement, and the like of the image, which are grasped by the picture or video analysis unit 141.

For example, the risk determination unit 143 may determine the degree of risk of collision in substrate transfer, based on an area in which the image is located, the size of the image, an interval between a plurality of pictures or videos, or the like, which is a result of the analysis of the picture or video analysis unit 141. In addition, in a case where the photographed picture or video is a video, the risk determination unit 143 may determine the degree of risk for the substrate transfer based on a movement direction of the image tracked by the picture or video analysis unit 141, a moved position, the degree of variation in a distance between a plurality of pictures or videos, and the like.

The risk determination unit 143 may perform determination by classifying the situations of the substrate transfer into collision risk, collision caution, transfer safety, and the like.

The transfer control unit 145 may control the substrate transfer based on a determination result of the risk determination unit 143. For example, in a case where the risk determination unit 143 determines the situation to be collision risk, the transfer control unit 145 may control the drive unit 140 to stop the substrate transfer. In addition, in a case where the risk determination unit 143 determines the situation to be the collision caution, the transfer control unit 145 may control the drive unit 130 to reduce the speed of the substrate transfer or move to a safety area.

Figure 4:
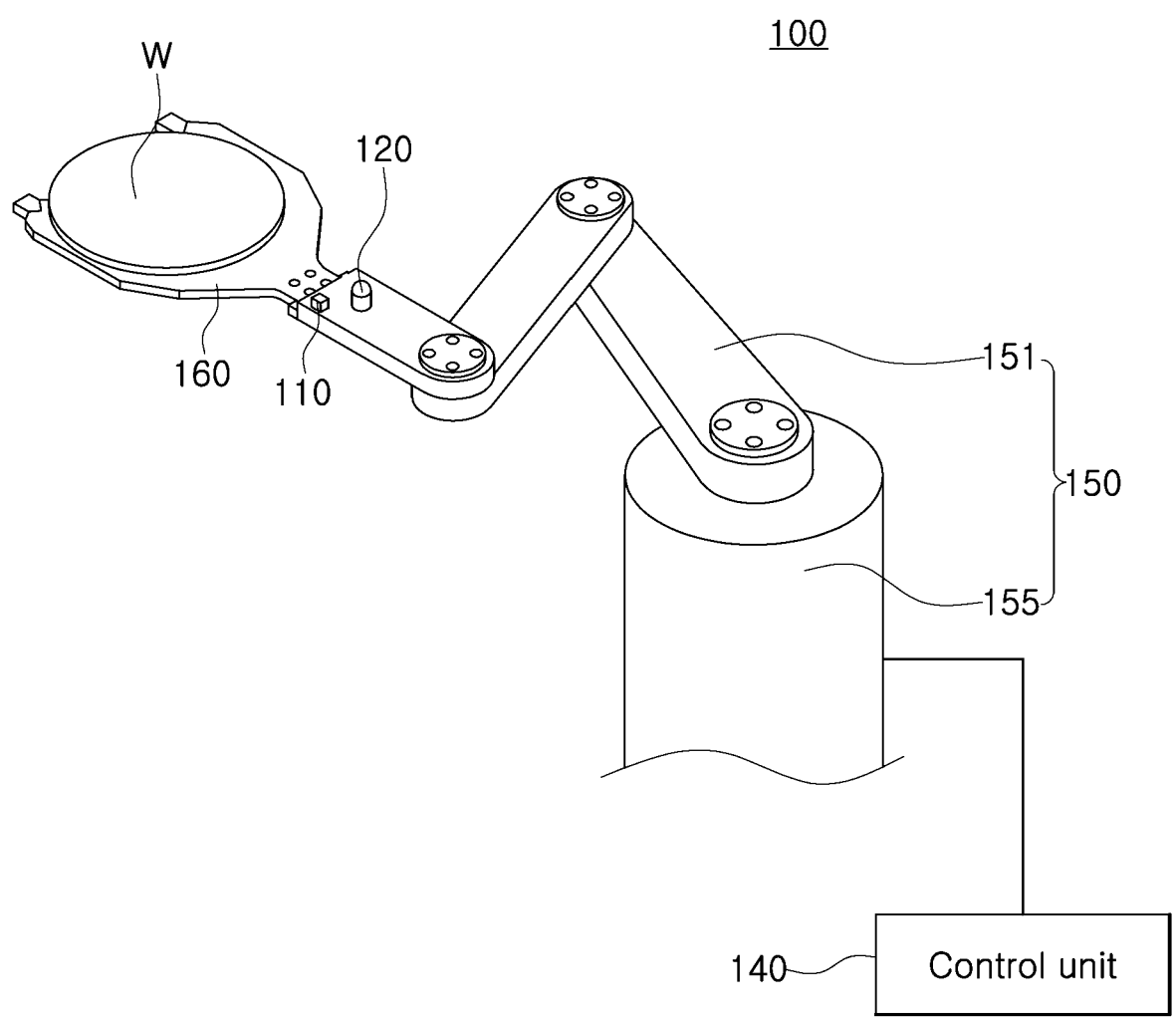
FIG. 4 illustrates an example of the substrate transfer assembly according to the present invention.
Figure 5A:
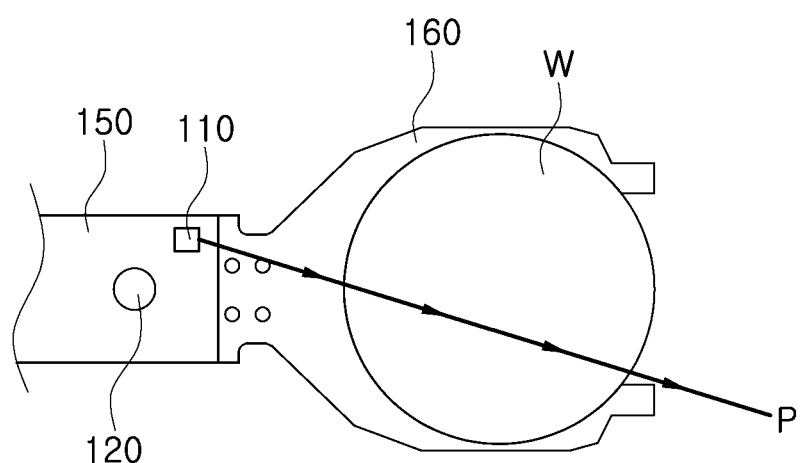
FIGS. 5A and 5B are a top plan view and a side view illustrating main parts of the example of the substrate transfer assembly according to the present invention.
Figure 5B:
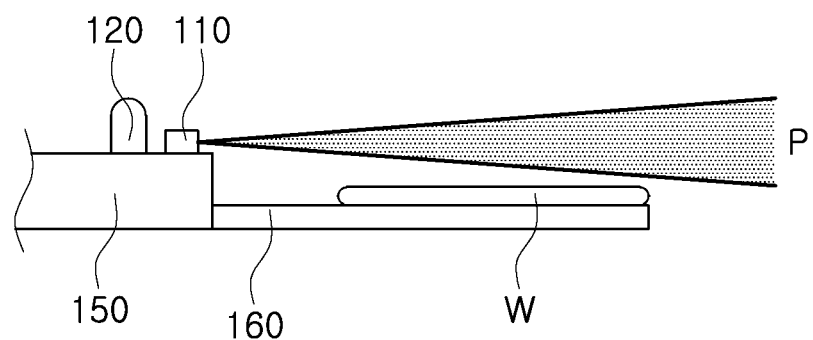

FIGS. 4 to 5B illustrate an example of the substrate transfer assembly according to the present invention.

FIG. 4 is a perspective view illustrating an example of the substrate transfer assembly according to the present invention. FIGS. 5A and 5B are a top plan view and a side view illustrating main parts of the example of the substrate transfer assembly according to the present invention.

The substrate transfer assembly 100 may include a robot body 150, a substrate support 160, the light emitting section 110, the photographing section 120, the control unit 140, and the like.

The robot body 150 may include an arm 151, a support body 155, and the like. The arm 151 is equipped with a plurality of joints so that the length can increase or decrease. The support body 155 may move and rotate through a rail or the like. The movement and rotation, and the stretch and contraction of the robot body 150 may be performed by control of the control unit 140 on the drive unit 130.

The substrate support 160 may be disposed at the tip of the arm 151, and a substrate to be transferred may be mounted on the substrate support 160. The substrate support 160 is an end effector, and various forms in which a substrate such as a wafer can be stably mounted and transferred may be applied.

The light emitting section 110 and the photographing section 120 may be disposed on the upper surface of the tip of the arm 151.

As described in the above example, the light emitting section 110 may be disposed on one side spaced from the center on the upper surface of the tip of the arm 151, and thus may emit light P having a form of a vertical line, toward another side in a diagonal direction of the forward movement path. A light emission angle and the intensity of the light emitting section 110 may be adjusted so as not to cause the emitted light P to affect the mounted substrate or to deviate from the substrate mounted on the substrate support 160.

In addition, in the above example, a case where the light emitting section 110 is disposed on the upper surface of the tip of the arm 151 has been described. The light emitting section 110 may be disposed on the side surface of the tip of the arm 151 if necessary.

The light P emitted from the light emitting section 110 may have a form of a vertical line, but the intensity and the shape of the emitted light P may be variously adjusted, for example, a circular or polygonal shape, if necessary.

In the light emitting section 110, light having various wavelength range may be selected and emitted. Preferably, laser light may be emitted. The laser light emitted at this time may be colored so as to more clearly recognize the image.

The photographing section 120 may photograph a forward direction in which light is emitted from the light emitting section 110. Preferably, the photographing section 120 may photograph an image formed on a front object by light emitted from the light emitting section 110, to generate a photographed picture or video.

In the above example, a case where the photographing section 120 includes one camera and is disposed on the upper surface of the tip of the arm 151 has been described. The position at which the photographing section 120 is located, and the number of cameras may be changed as required. For example, the photographing sections 120 may be spaced from each other and photograph, at different angles, an image formed on a front object by light.

Figure 6:
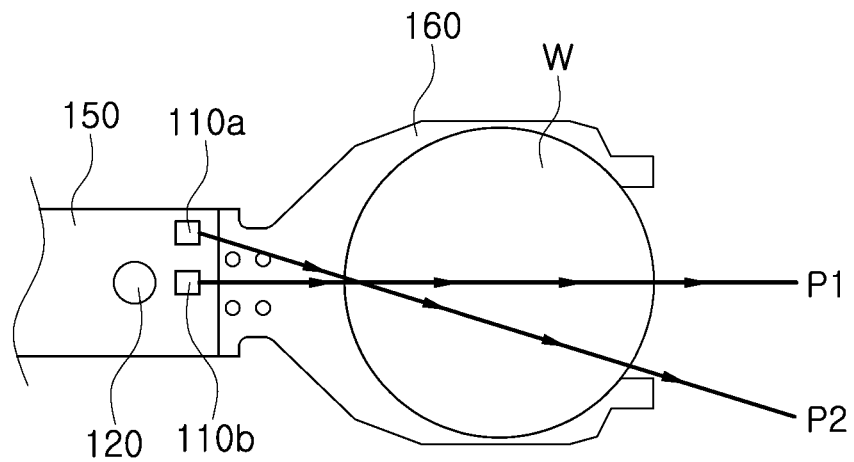
FIG. 6 is a top plan view illustrating main parts of another example of the substrate transfer assembly according to the present invention.

The arrangement and the number of components of the substrate transfer assembly according to the present invention may be variously changed. FIG. 6 is a top plan view illustrating the main parts of another example of the substrate transfer assembly according to the present invention.

In the example in FIG. 6, the light emitting section 110 may include a plurality of light emitting units. The light emitting section 110 may include a first light emitting unit 110b and a second light emitting unit 110a. The first light emitting unit 110b is disposed at the center of the robot body 150 and emits a first ray P1 of light in the direction of the forward movement path. The second light emitting unit 110a is disposed on one side spaced from the center of the robot body 150 and emits a second ray P2 of light toward another side in the diagonal direction of the forward movement path. Here, the portion of the robot body 150 at which the light emitting section is disposed may be the tip of the arm 151 as in the above example.

As described in the above example, the first ray P1 of light emitted from the first light emitting unit 110b and the second layer P2 of light emitted from the second light emitting unit 110a may travel forward to intersect with each other.

In addition, the first ray P1 of light emitted from the first light emitting unit 110b and the second ray P2 of light emitted from the second light emitting unit 110a may be colored. Laser light having the same color may be adopted, and more preferably, rays of laser light having different colors may be adopted.

The arrangement positions of the first light emitting unit 110b and the second light emitting unit 110a and directions of light emitted may be variously changed.

The photographing section 120 may generate a photographed picture or video by photographing images formed by the first ray P1 of light and the second ray P2 of light emitted from the first light emitting unit 110b and the second light emitting unit 110a.

According to the present invention, there is provided a substrate transfer method by the substrate transfer assembly described above. An example of the substrate transfer method according to the present invention will be described below with the above-described example of the substrate transfer assembly according to the present invention.

Figure 7:
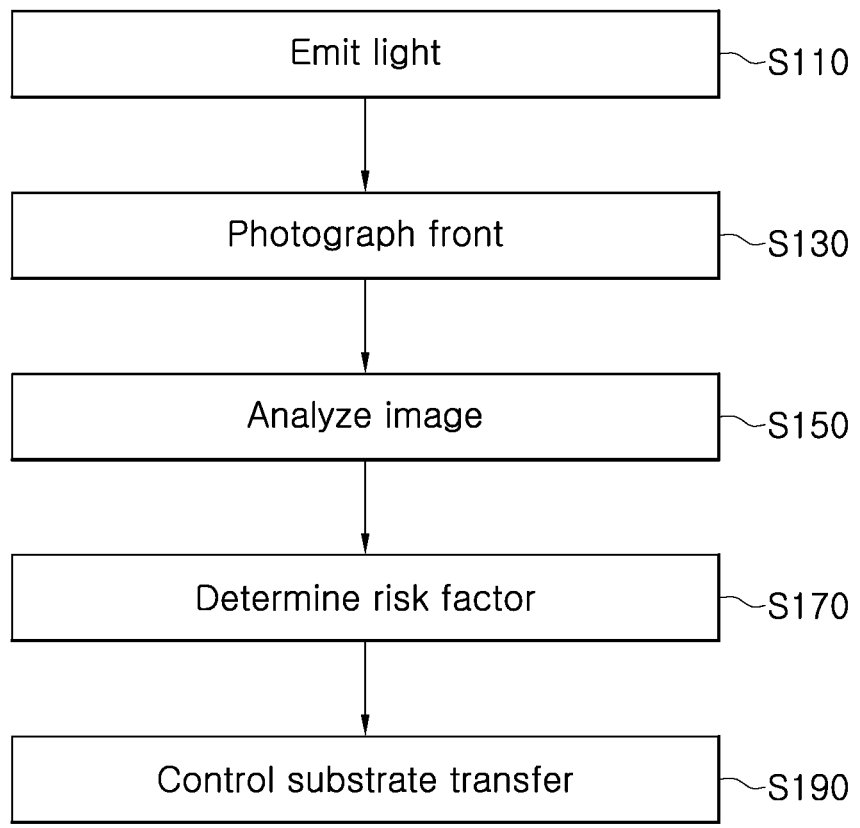
FIG. 7 is a flowchart illustrating an example of a substrate transfer method according to the present invention.

FIG. 7 is a flowchart illustrating the example of the substrate transfer method according to the present invention.

The substrate transfer assembly 100 emits light forward through the light emitting section 110 during movement for substrate transfer or ahead of the movement for substrate transfer (S110). The photographing section 120 photographs an image formed by the emitting light reaching a front object (S130) to acquire a photographed picture or video.

The photographed picture or video generated by the photographing section 120 is provided to the control unit 140. The control unit 140 may analyze the photographed picture or video (S150) and determine a risk factor based on an image present in the photographed picture or video (S170). The control unit 140 may control the drive unit 130 to control substrate transfer in accordance with the determined risk factor (S190).

Various examples of such a substrate transfer method according to the present invention will be described.

Figure 8A:
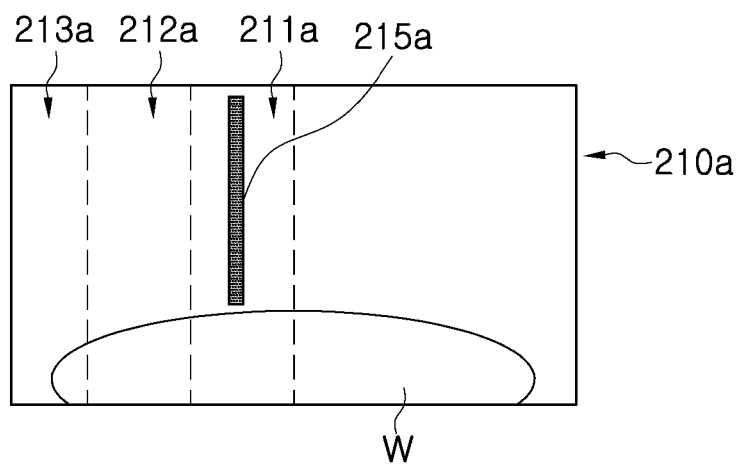
FIGS. 8A to 8C illustrate a first example of risk factor determination in the substrate transfer method according to the present invention.
Figure 8B:
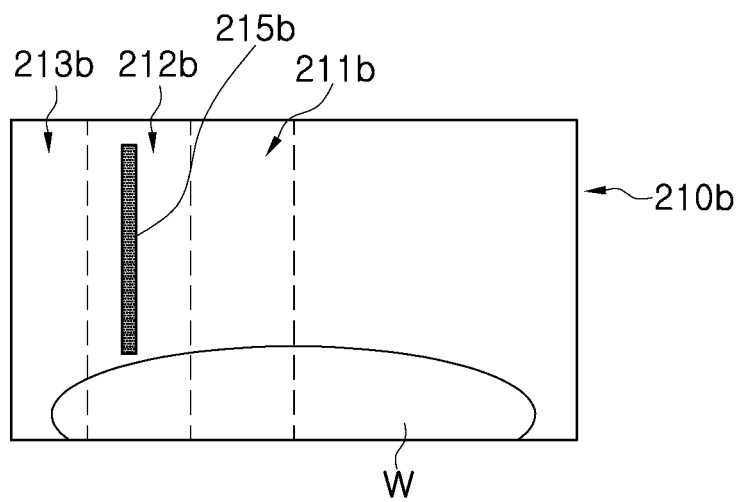
Figure 8C:
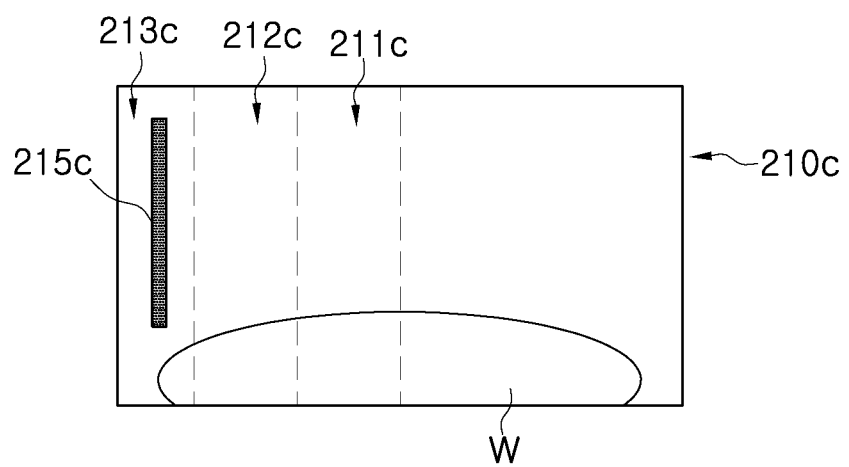

FIGS. 8A to 8C illustrate a first example of risk factor determination in the substrate transfer method according to the present invention.

The first example is an example of emitting light having a vertical line in the diagonal direction of the forward movement path and determining a risk factor based on a photographed picture or video obtained by photographing the front.

When there is an object in front, images 215a, 215b, and 215c formed on a front object by the emitted light are present in photographed picture or videos 210a 210b, and 210c obtained by photographing the front. The risk factor may be determined based on the position, shape, and magnitude of an image.

For example, the photographed picture or video 210a, 210b, or 210c may be divided into a plurality of areas, and the plurality of areas may be classified into risky areas 211a, 211b, and 211c, caution areas 212a, 212b, and 212c, and safe areas 213a, 213b, and 213c. Then, the risk factor may be determined in accordance with the area in which the image is located. That is, since the light is emitted in the diagonal direction of the forward movement path, the image can be formed to become closer to the central portion from the outer portion of the photographed picture or video in accordance with the degree of approaching the front object.

In the case of FIG. 8A, the image 215a of the vertical line is located in the risky area 211a close to the central portion, and thus may be determined to be within a collision risky distance with the front object. In this case, it is possible to perform control to stop substrate transfer.

In the case of FIG. 8B, the image 215b of the vertical line is located in the caution area 212b spaced from the central portion at a predetermined distance, and thus may be determined to be within the collision risky distance with the front object. In this case, it is possible to perform control to reduce the speed of the substrate transfer or move to avoid the front object.

In the case of FIG. 8C, the image 215c of the vertical line is located in the safe area 213c which is sufficiently spaced from the central portion, and thus may be determined to be within a safe distance in which collision risk with the front object is low. In this case, it is possible to perform control to maintain the substrate transfer.

Figure 9:
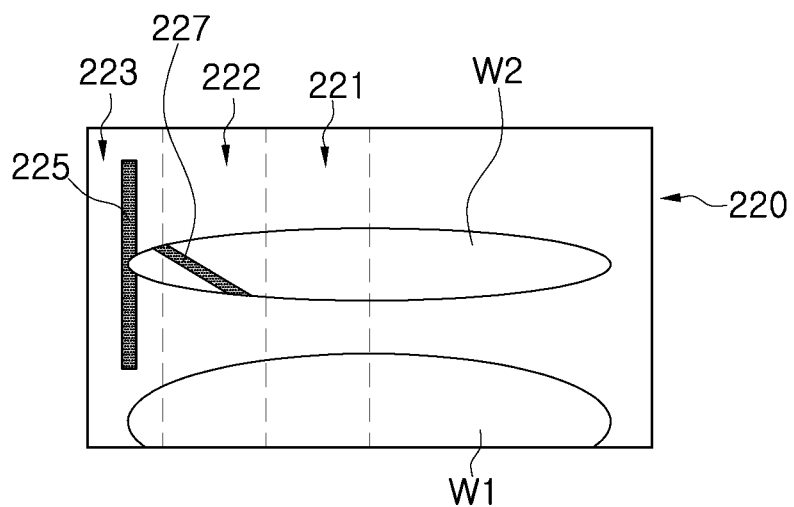
FIG. 9 illustrates a modification example of the first example of the risk factor determination in the substrate transfer method according to the present invention.

FIG. 9 illustrates a modification example of the first example of the risk factor determination in the substrate transfer method according to the present invention.

The modification example is an example of emitting light of a vertical line in the diagonal direction of the forward movement path and determining a risk factor based on a photographed picture or video obtained by photographing the front, as in the first example.

In the modification example, in a photographed picture or video 220, an image 225 of a vertical line is located in a safe area 213, but a wafer substrate W2 is located in front. An image 227 is formed by light emitted above the wafer substrate W2 located in front.

In such a case, a risk factor may be determined based on the position of the image 227 of a diagonal line and the angle of the diagonal line. That is, when a portion of the image of the diagonal line is located in a risky area 221 or the angle of the image of the diagonal line is equal to or larger than a predetermined level, it is possible to determine that the image is within the collision risky distance with the front object. In this case, it is possible to perform control to stop substrate transfer.

Figure 10A:
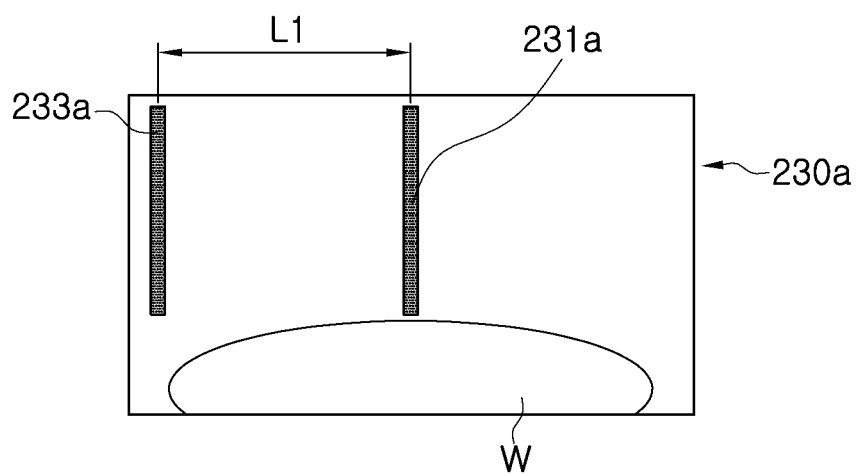
FIGS. 10A to 10C illustrate a second example of the risk factor determination in the substrate transfer method according to the present invention.
Figure 10B:
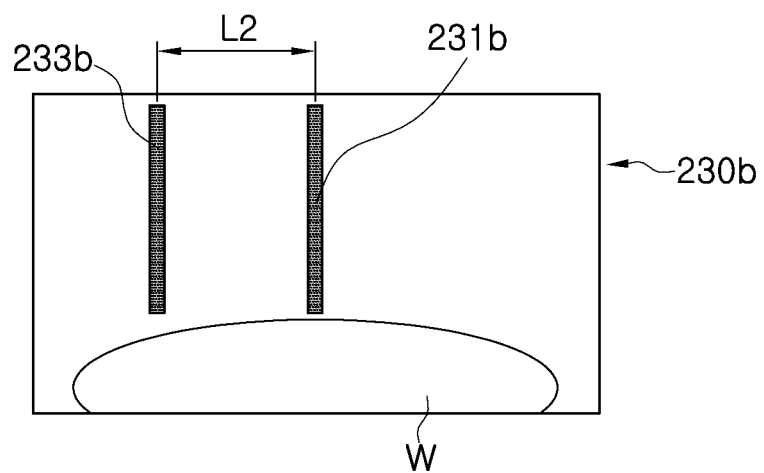
Figure 10C:
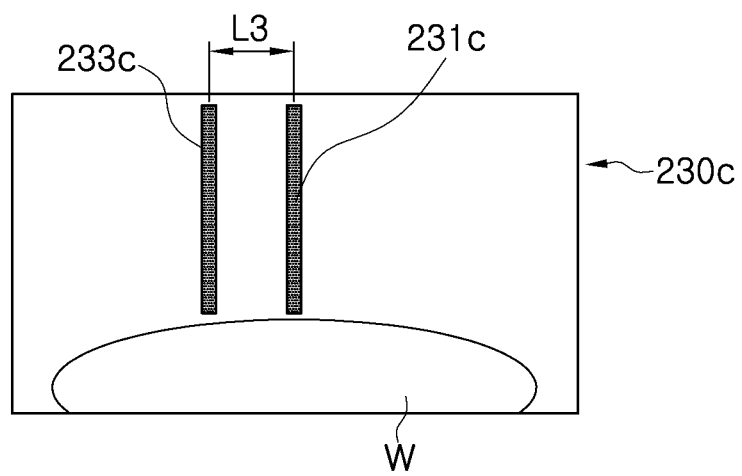

FIGS. 10A to 10C illustrate a second example of the risk factor determination in the substrate transfer method according to the present invention.

The second example is an example of determining a risk factor based on photographed picture or videos 230a, 230b, and 230c obtained by photographing first images 231a, 231b, and 231c formed by emitting first rays of light in a vertical line in the direction of the forward movement path and second images 233a, 233b, and 233c formed by emitting second rays of light in a vertical line in the diagonal direction of the forward movement path.

The first ray and the second ray intersect with each other in front to form the first image and the second image on the front object. Thus, as the distance between the first image and the second image increases, it may be determined that the front object is at an adjacent distance. That is, it is possible to determine the risk factor based on a distance between the first images 231a, 231b, and 231c and the second images 233a, 233b, and 233c in the photographed picture or videos 230a, 230b, and 230c.

As in FIG. 10A, a distance L1 between the first image 231a and the second image 233a in the photographed picture or video 230a is a sufficient distance. Thus, it is possible to determine that the image is located in the safe area. In this case, it is possible to perform control to maintain substrate transfer.

As in FIG. 10B, a distance L2 between the first image 231b and the second image 233b in the photographed picture or video 230b is a distance in a predetermined level range. Thus, it is possible to determine that the image is in the caution area. In this case, it is possible to perform control to reduce the speed of substrate transfer or move to avoid the front object.

As in FIG. 10C, a distance L3 between the first image 231c and the second image 233c in the photographed picture or video 230c is a distance that is shorter than the predetermined level range. Thus, it is possible to determine that the image is located in the risky area. In this case, it is possible to perform control to stop substrate transfer.

In the second example in FIGS. 10A to 10C, as in FIGS. 8A to 9, the degree of risk of collision may be grasped by dividing the photographed picture or video into areas.

Figure 11A:
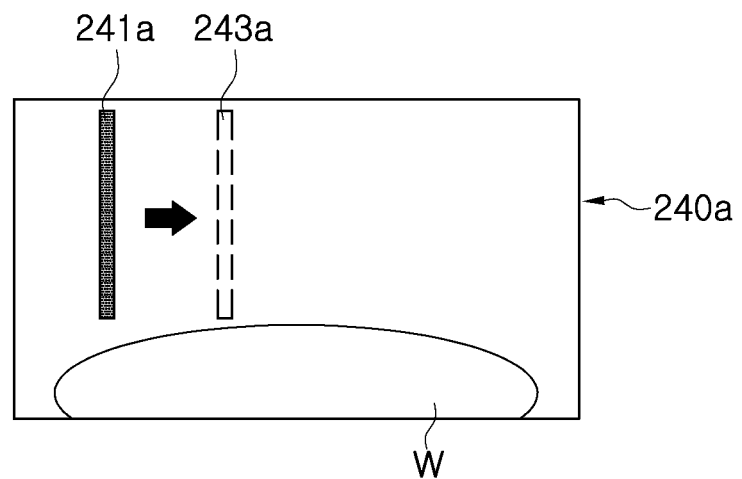
FIGS. 11A and 11B illustrate a third example of the risk factor determination in the substrate transfer method according to the present invention.
Figure 11B:
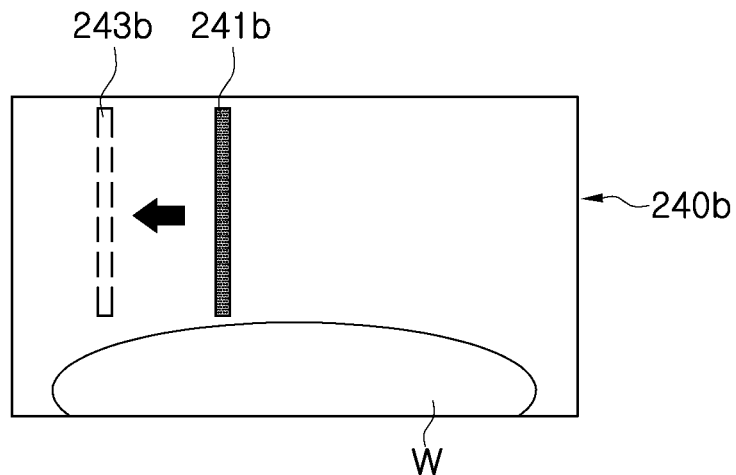

FIGS. 11A and 11B illustrate a third example of the risk factor determination in the substrate transfer method according to the present invention.

The third example is an example of determining the risk factor based on a video obtained by photographing, in real time, an image formed by emitting light in a vertical line in the diagonal direction of the forward movement path.

It is possible to determine the risk factor based on various change factors such as a movement direction and a movement speed in addition to the position of an image 241a or 241b of a vertical line from a real-time photographed video 240a or 240b.

In addition, it is possible to determine the risk factor based on various change factors such as a position change, a movement direction, and a movement speed of the image of the vertical line from a plurality of pictures periodically photographed.

As in FIG. 11A, an image 241a at a first position in the real-time photographed video 240a moves to a second position toward the central portion, and thus an image 243a is formed. In this case, it may be determined that a collision risk probability increases gradually. In addition, since the movement speed of the image gradually decreases from the outer portion to the central portion, the degree of risk of collision may be determined based on the movement speed of the image.

As in FIG. 11B, an image 241b at a first position in the real-time photographed video 240b moves to a second position toward the outer portion, and thus an image 243b is formed. In this case, it may be determined that a collision risk probability is decreased. In addition, since the movement speed of the image gradually increases from the central portion to the outer portion, the degree of risk of collision may be determined based on the movement speed of the image.

In the third example in FIGS. 11A and 11B, as in FIGS. 8A to 9, the degree of risk of collision may be grasped by dividing the photographed picture or video into areas.

Figure 12:
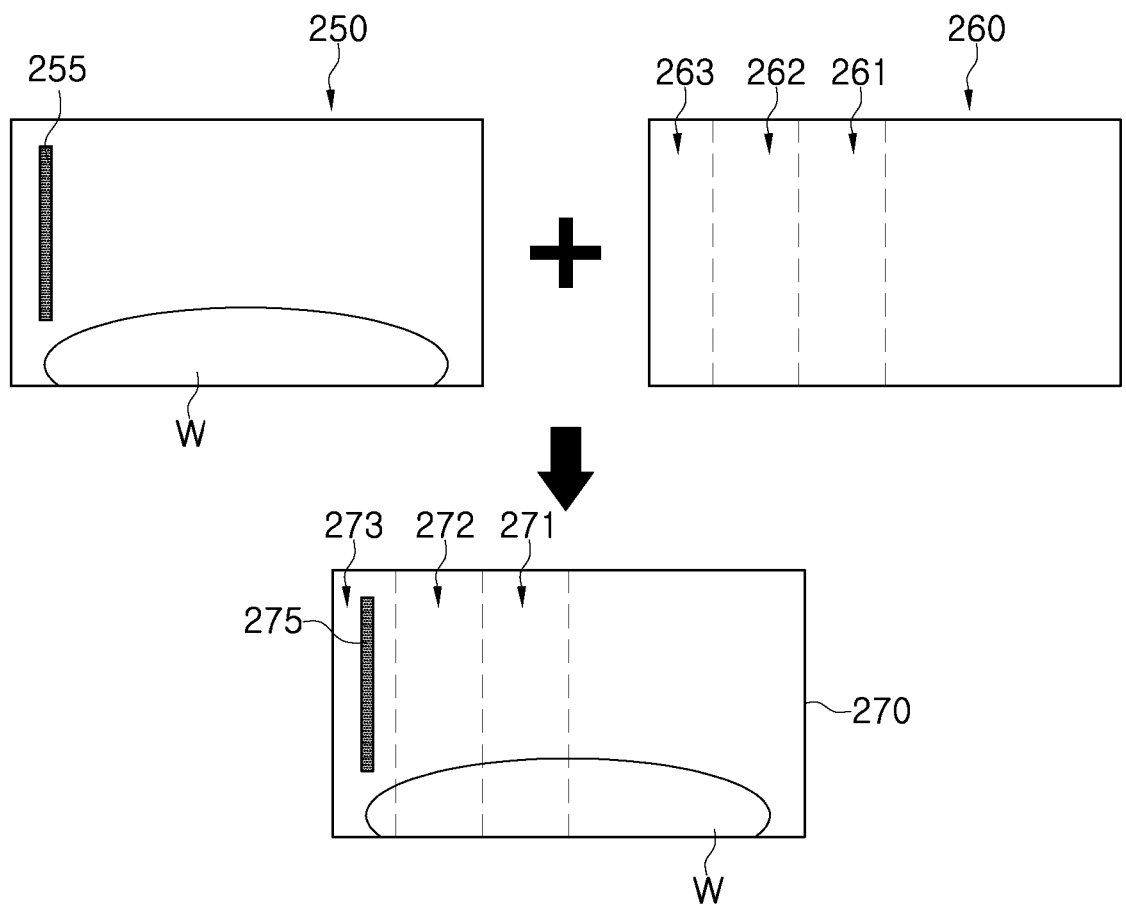
FIG. 12 illustrates an example of generating a combined picture or video by matching an area layer with a photographed picture or video in the substrate transfer method according to the present invention.

In a case where the degree of risk of collision is grasped by dividing the area of the photographed picture or video, the picture or video analysis unit 141 in the control unit 140 may generate a combined picture or video 270 by matching an area layer 260 in which division into a plurality of areas 261, 262, and 263 is performed, with a real-time photographed picture or video 250, and determine the degree of risk of collision based on the position of an image 275 that moves between the plurality of areas 261, 262, and 263 in the combined picture or video 270, as illustrated in FIG. 12.

Such a method of generating the combined picture or video by matching the area layer 260 in which division into the plurality of areas 261, 262, and 263 is performed, with the photographed picture or video and more easily determining the degree of risk of collision based on the combined picture or video may be applied to the first example and the second example described above.

Hitherto, according to the present invention, it is possible to stably and reliably prevent collision with a front object in substrate transfer with a substrate transfer robot.

In particular, in the case of recognizing a front object by emitting light and receiving reflected light, it is possible to solve the problem of difficulty in recognizing all wide areas in front. In addition, in the case of recognizing a front object from a front photographed picture or video, it is possible to solve the problem of difficulty in a quick and immediate response because an analysis on all objects present in the photographed picture or video is required.

Although the above description of the present disclosure has been provided for illustrative purposes, those skilled in the art will appreciate that various modifications, additions, and substitutions are possible, without departing from essential characteristics of the disclosure. Therefore, embodiments of the present disclosure are not intended to limit the technical spirit of the disclosure but rather to describe the technical spirit of the disclosure, and the scope of the disclosure is not to be limited by the above embodiments. The protection scope of the present invention should be construed by the following claims, and all technical ideas within the scope equivalent thereto should be construed as being included in the scope of the present invention.

What is claimed is:

1. A substrate transfer assembly that transfers a substrate, the assembly comprising: a robot arm configured to transfer the substrate; a laser disposed at the robot arm and emitting one or more rays of light; an image sensor disposed at the robot arm and generating a photographed picture or video including an image of a front object by the one or more emitted rays of light; and a control circuit configured to control transfer of the substrate by dividing the photographed picture or video into a plurality of areas, and determining a risk factor based on an area in which the image is located within the photographed picture or video.

2. The substrate transfer assembly according to claim 1, further comprising: a substrate support configured to hold the substrate and connected to a first end of the robot arm, wherein the laser is disposed at a first region of the robot arm, adjacent to the first end of the robot arm, and emits a first ray of the one or more rays of light in a diagonal direction of a forward movement path of the substrate support.

3. The substrate transfer assembly according to claim 2 wherein the risk factor is determined in accordance with an area in which the image is located among the plurality of areas.

4. The substrate transfer assembly according to claim 1, further comprising:
   a substrate support configured to hold a substrate and connected to a first end of the robot arm,
   wherein the laser includes a first laser and a second laser,
   wherein the first laser is disposed at the center of a first region of the robot arm, which is adjacent to the first end of the robot arm, and emits a first ray of light in a first direction of a forward movement path of the substrate support,
   wherein the second laser is disposed at the first region, is adjacent to the first laser in a second direction perpendicular to the second direction, and emits a second ray of light in a diagonal direction of the forward movement path of the substrate support, and
   wherein the risk factor is determined based on a relative position between a first image formed by the first ray of light and a second image formed by the second ray of light in the photographed picture or video.

5. The substrate transfer assembly according to claim 1,
   wherein the image sensor periodically generates the image of the front object by the emitted rays of light, and
   wherein the risk factor is determined based on a change factor of the image by comparing a plurality of pictures or videos periodically photographed.

6. The substrate transfer assembly according to claim 1,
   wherein the image sensor generates the image of the front object by the emitted rays of light, in real time, and
   wherein the risk factor is determined based on a change factor of the image from a video obtained in real time.

7. The substrate transfer assembly according to claim 1,
   wherein the image sensor is provided in plural, wherein the plurality of image sensors are configured to generate a plurality of pictures or videos including images of the front object taken at different angles by the one or more rays of light, and
   wherein the control circuit is configured to compare the plurality of pictures or videos to extract the image.

8. The substrate transfer assembly according to claim 1, wherein the control circuit is further configured to:
generate a combined picture or video by matching an area layer, in which division into the plurality of areas is performed, with the photographed picture or video, and
wherein the risk factor is determined based on an area at which the image is located within the combined picture or video.

9. The substrate transfer assembly according to claim 1, wherein the laser emits the one or more rays of light having the same color or emits two or more rays of light having different colors.

10. The substrate transfer assembly according to claim 1, further comprising: a substrate support that disposed to move forward from the robot arm and supports the substrate in a horizontal direction.

11. The substrate transfer assembly according to claim 10, wherein the laser emits rays of light to deviate from the substrate mounted on the substrate support.

12. A substrate transfer method of transferring a substrate, the method comprising:
emitting light;
generating a picture or video including an image of a front object by the emitted light; and
controlling transfer of the substrate by dividing the photographed picture or video into a plurality of areas, and determining a risk factor based on an area in which the image is located within the picture or video.

13. The substrate transfer method according to claim 12, where, in in the controlling, a distance between the substrate and the front object is determined based on at least one of a position and a shape of the image present in the photographed picture or video.

14. The substrate transfer method according to claim 12, wherein, in the emitting, the light is emitted in a diagonal direction of a forward movement path of the substrate, and
wherein the risk factor is determined in accordance with an area in which the image is located within the picture or video.

15. The substrate transfer method according to claim 12, wherein, in the emitting, a first ray of light in a direction of a forward movement path and a second ray of light in a diagonal direction of the forward movement path are emitted, and
wherein the risk factor is determined based on a relative position between a first image formed by the first ray of light and a second image formed by the second ray of light in the photographed picture or video.

16. The substrate transfer method according to claim 12, wherein the emitting is continuously performed,
wherein the generating of the picture or video is periodically performed, and
wherein the risk factor is determined based on a change factor of the image by comparing a plurality of pictures or videos periodically photographed.

17. The substrate transfer method according to claim 12, wherein the emitting and the generating of the picture or video are continuously performed in real time, and
wherein the risk factor is determined based on a change factor of the image in a real-time photographed picture or video.

18. The substrate transfer method according to claim 17, wherein, in the controlling, an area layer in which division into the plurality of areas is performed is matched with the real-time photographed picture or video, and
wherein the risk factor is determined based on a position of the image that moves between the plurality of areas.

19. The substrate transfer method according to claim 12, wherein, in the generating of the picture or video, a plurality of photographed picture or videos are generated by photographing the image at different angles or at different positions in the same time period, and
wherein, the image is extracted by comparing the plurality of photographed picture or videos and a position or a size of the image is grasped.

20. A substrate transfer assembly that transfers a substrate, the assembly comprising: a robot arm configured to transfer the substrate; a substrate support connected to a first end of the robot arm and configured to support the substrate; a laser disposed at a first region of the robot arm, and emits a ray of light in a diagonal direction of a forward movement path of the substrate support, wherein the first region is adjacent to the first end of the robot arm, and wherein the laser is disposed adjacent to a side of the first region which is spaced apart from a center of the first region in a direction perpendicular to the forward movement path of the substrate support; an image sensor disposed at the robot arm and photographing a picture or video including an image of a front object by the emitted ray of light; and a control circuit configured to control transfer of the substrate by dividing the photographed picture or video into a plurality of areas, and determining a risk factor based on an area in which the image is located within the picture or video.

* * * * *